US006633189B1

United States Patent
Gradinariu et al.

(12) United States Patent
(10) Patent No.: US 6,633,189 B1
(45) Date of Patent: Oct. 14, 2003

(54) CIRCUIT TO PROVIDE A TIME DELAY

(75) Inventors: Julian C. Gradinariu, Colorado Springs, CO (US); John J. Silver, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/037,247

(22) Filed: Oct. 23, 2001

(51) Int. Cl.[7] ................................................ H03H 11/26
(52) U.S. Cl. ........................................ 327/262; 327/264
(58) Field of Search ................................. 327/231, 264, 327/272, 278, 285, 262, 261

(56) References Cited

U.S. PATENT DOCUMENTS

| 5,051,630 A | * | 9/1991 | Kogan et al. ............... 307/603 |
| 5,250,914 A | * | 10/1993 | Kondo ........................ 331/111 |
| 5,355,038 A | * | 10/1994 | Hui ............................ 307/603 |
| 5,748,542 A | | 5/1998 | Zheng et al. ................ 365/194 |
| 5,880,623 A | * | 3/1999 | Levinson ..................... 327/540 |
| 5,917,762 A | | 6/1999 | Zheng et al. ................ 365/194 |
| 6,044,027 A | | 3/2000 | Zheng et al. ................ 365/194 |
| 6,163,195 A | * | 12/2000 | Jeffersen ..................... 327/262 |
| 6,191,630 B1 | * | 2/2001 | Ozawa et al. ............... 327/278 |

* cited by examiner

*Primary Examiner*—Dinh T. Le
(74) *Attorney, Agent, or Firm*—Law Office of Dale B. Halling, LLC

(57) ABSTRACT

A circuit for providing substantially a constant delay of an electrical signal that compensates for voltage, temperature and process variations includes an inverter. A delay cell has an output that is coupled to the inverter. The delay cell includes a charge transistor coupled to a capacitor. A control circuit has an output that is coupled to a gate of the charge transistor. The output has a voltage that is proportional to a trip voltage of the inverter. The delay cell also has a discharge transistor. The control circuit contains a second output that is coupled to a gate of the discharge transistor. The second output has a voltage that is also proportional to the trip voltage of the inverter.

19 Claims, 5 Drawing Sheets

CIRCUIT TO PROVIDE A TIME DELAY

FIELD OF THE INVENTION

The present invention relates generally to the field of electronic circuits and more particularly to a circuit to provide a time delay.

BACKGROUND OF THE INVENTION

A number of circuits for providing a time delay in an electrical circuit are known. These circuits suffer from significant variations in the time delay provided by the circuit. One of the reasons these circuits have significant variations is that they do not adjust for variations in the supply voltage. One solution has been to add a control stage to the delay circuit. The control stage regulates the supply current that flows between the supply terminal and the delay stage to provide a relatively constant delay time over a range of supply voltages. Unfortunately, the control circuit does not adjust for process variations in the delay cell or the control stage. Process variations occur during the manufacture of a semiconductor circuit and result in components not having exactly the electrical properties specified. Another source of variations in the delay is due to temperature changes. Temperature variations result in changes in the properties of the components making up the circuit. These changes result in variations in the delay time of the circuit.

Thus there exists a need for a circuit to provide a time delay that compensates for supply voltage variations, temperature variations and process variations to provide a substantially constant delay.

SUMMARY OF INVENTION

A circuit for providing a substantially constant delay of an electrical signal that compensates for voltage, temperature and process variations includes an inverter. A delay cell has an output that is coupled to the inverter. The delay cell includes a charge transistor coupled to a capacitor. A control circuit has an output that is coupled to a gate of the charge transistor. The output has a voltage that is proportional to a trip voltage of the inverter. The delay cell also has a discharge transistor. The control circuit contains a second output that is coupled to a gate of the discharge transistor. The second output has a voltage that is also proportional to the trip voltage of the inverter.

The circuit provides the substantially constant delay in part because of the symmetry of the circuit design. This results in symmetrical variations in all the interrelated components of the circuit. The circuit is also controlled by a mathematical formula wherein the rise time is equal to the fall time are proporational to a capacitance times a resistance.

DETAILED DESCRIPTION OF THE DRAWINGS

Figure 1:
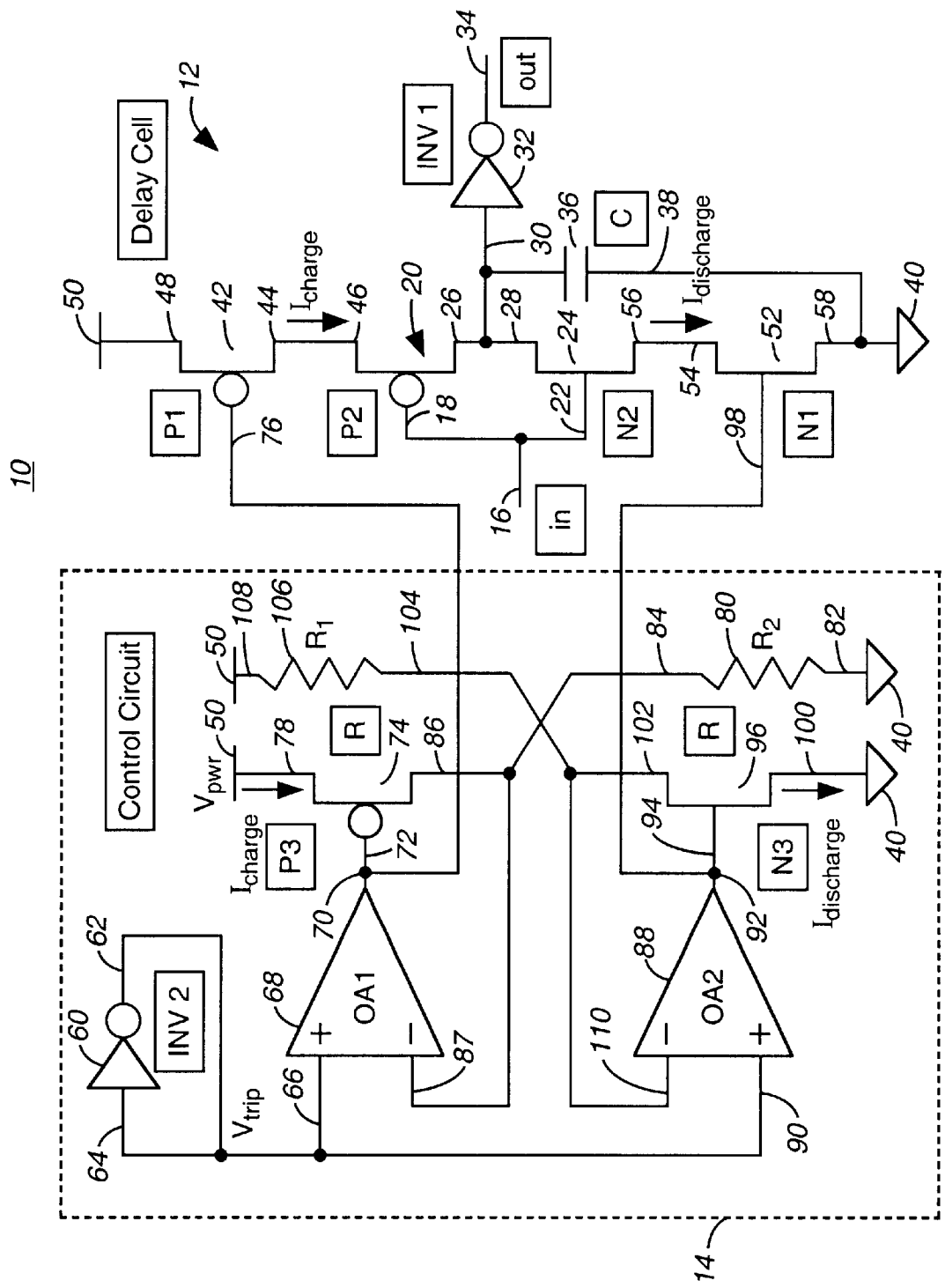
FIG. 1 is a block diagram of a circuit for providing a delay in accordance with one embodiment of the invention.

A circuit for providing a substantially constant delay despite process, temperature and supply voltage variations is important because it improves the margins on opposite-going timing parameters, such as set-up and hold time. FIG. 1 is a block diagram of a circuit 10 for providing a delay in accordance with one embodiment of the invention. The circuit 10 has a delay cell (means for delaying an electrical signal) 12 and control circuit 14. The delay cell 12 has an input 16 coupled to the gate 18 of a p-transistor 20 (P2) and a gate 22 of an n-transistor 24 (N2). The drain 26 of the p-channel transistor 20 is coupled to a drain 28 of the n-channel transistor 24 and to the input 30 of an inverter 32. The output 34 of the inverter (output inverter) 32 forms the output of the delay cell 12. The input 30 of the inverter 32 is coupled to a capacitor 36. The other end 38 of the capacitor 36 is coupled to ground 40. A charge transistor 42 (p-transistor, P1, means for charging, control transistor) has its drain 44 coupled to a source 46 of the p-channel transistor 20. The source 48 of the charge transistor 42 is coupled to a supply voltage 50. A discharge transistor 52 (n-transistor, Ni, means for discharging, second control transistor) has its drain 54 coupled to the source 56 of the n-channel transistor 24. The source 58 of the discharge transistor 52 is coupled to ground 40.

When the input signal transitions low, the transistor 20 turns on and transistor 24 turns off. Transistor 42 current (charging current) then flows into the capacitor 36. When the voltage on the capacitor reaches the trip voltage of the inverter 32, the inverter transitions from high to low. When the input signal transitions high, the transistor 20 turns off and the transistor 24 turns on. Transistor 52 current (discharge current) then flows out of the capacitor 36. When the voltage on the capacitor falls to the trip voltage of the inverter 32, the inverter transitions from low to high. The capacitor 36 provides a delay in the transition of the electrical signal. The charging transistor 42 and the discharging transistor 52 are controlled by the control circuit 14.

The control circuit 14 has a replica inverter (inverter) 60 with the output 62 coupled to the input 64 (total negative feedback). The replica inverter 60 is a replica of the inverter 32. As a result, the trip voltage of the inverter 32 is equal to the trip voltage of the inverter 60. The replica inverter 60 is coupled to a non-inverting input 66 of a charge operational amplifier 68. An output (first means) 70 of the operational amplifier 68 is coupled to a gate 72 of a replica charge transistor 74 (p-channel transistor, P3, mirror control transistor) and the gate 76 of the charge transistor 42. Note that the replica charge transistor 74 is a replica of the charge transistor 42. A source 78 of the replica charge transistor 74 is coupled to the supply voltage (power supply voltage) 50. A charging resistor (first resistive element) 80 has a first end 82 coupled to ground 40 and a second end 84 coupled to a drain 86 of the p-channel transistor 74. A non-inverting input 87 of the operational amplifier 68 is coupled to the drain 86 of the p-channel transistor 74.

A discharge operational amplifier (second operational amplifier) 88 has a non-inverting input 90 coupled to an output 62 of the replica inverter 60. The output (second means) 92 of the discharge operational amplifier 88 is coupled to the gate 94 of the replica discharge transistor 96

(N3, n-channel transistor, second mirror control transistor) and to the gate 98 of the discharge transistor 52. The replica discharge transistor 96 is a replica of the discharge transistor 52 and therefore has similar electrical properties. A source 100 of the replica discharge transistor 96 is coupled to ground 40. A drain 102 of the replica discharge transistor 96 is coupled to one end 104 of a discharging resistor (second resistive element, second resistor) 106. A second end 108 of the discharge resistor 106 is coupled to the supply voltage 50. The drain 102 of the replica discharge transistor 96 is coupled to an inverting input 10 of the discharge operational amplifier 88.

By having total negative feedback of the replica inverter 60, the non-inverting inputs 66, 90 of the operational amplifiers 68, 88 are kept at the trip voltage of the replica inverter 60. The current (Icharge) through the replica charge transistor 74 is driven to result in a voltage across the resistor 80 equal to the trip voltage. Similarly the voltage on the non-inverting input 110 is driven to have a voltage of the trip voltage of the replica inverter 60. As a result, the voltage at the gate of the replica transistors 74, 96 is the same as the voltage at the gate of the transistors 42, 52 and is the voltage necessary to keep the inverting input 87, 110 equal to the trip voltage.

The replica transistors 74, 96 are designed so that the processing steps are the same as for the control transistors 42, 52. As a result, their parameters should be approximately the same. In addition, the transistors are not small devices. This allows more room for variations in the processing without significantly affecting the parameters of the transistors. The above is also true of the inverter 32 and replica inverter 60 and the resistors 80, 106.

Figure 2:
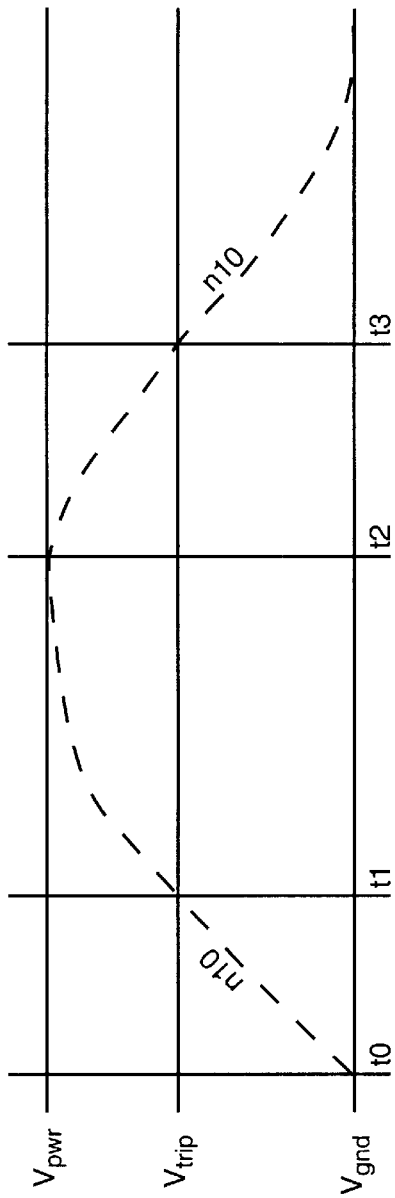
FIG. 2 is a graph of a rise time and a fall time of the circuit for providing a delay in accordance with one embodiment of the invention.

FIG. 2 is a graph of a rise time and a fall time of the circuit for providing a delay in accordance with one embodiment of the invention. From the graph the fall time and rise time is given by the equations below:

$$\Delta t_{fall} = t_1 - t_0 = C/I_1(V_{trip} - V_{gnd})$$

$$\Delta t_{rise} = t_3 - t_2 = C/I_2(V_{pwr} - V_{trip})$$

Since $$dv/dt = I/C$$

Where $I_1$ and $I_2$ are the currents generated by charging transistor 42 and discharging transistor 52 under the bias of the control circuit 14. Our goal is that:

$$\Delta t_{fall} = \Delta t_{rise} = \text{constant}$$

or $(V_{trip} - V_{gnd})/I_1 = (V_{pwr} - V_{trip})/I_2 = \text{constant}$

Note $V_{trip} = RI_1$

Thus $(V_{trip} - V_{gnd})/I_1 = R = \text{constant}$.

As a result we note the fall time and rise time equals:

$$\Delta t_{fall} = \Delta t_{rise} = RC$$

Thus as long as R is substantially the same for the resistor 106 and resistor 80 the rise and fall times are substantially the same.

Figure 3:
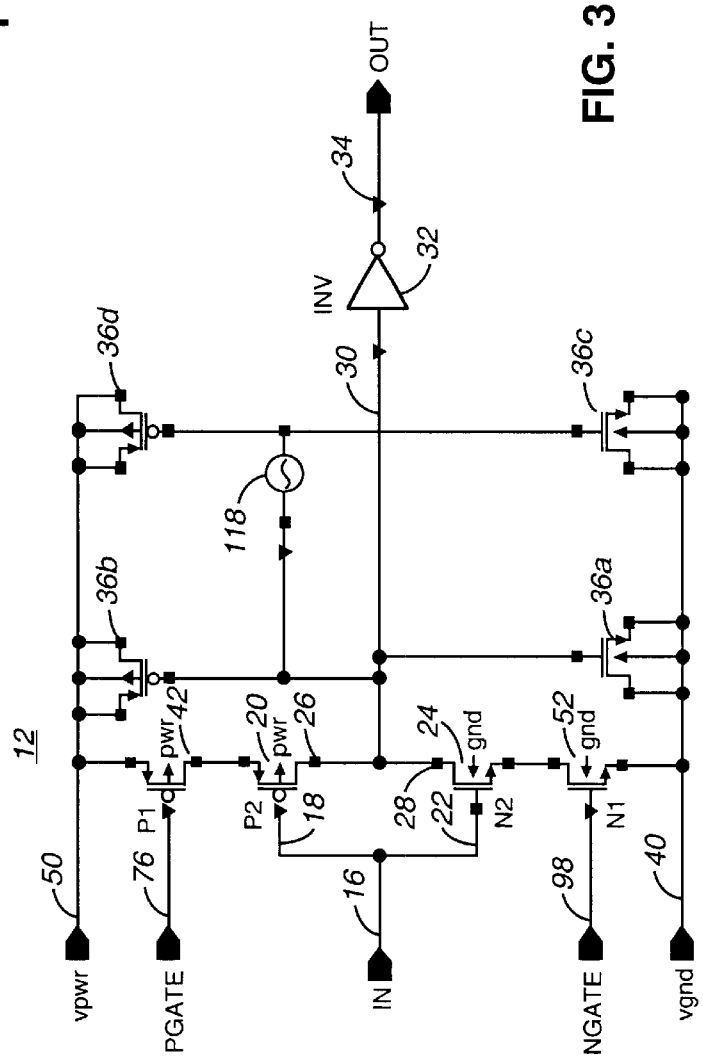
FIG. 3 is a schematic diagram of a delay cell in accordance with one embodiment of the invention.

FIG. 3 is a schematic diagram of a delay cell 12 in accordance with one embodiment of the invention. Note that the same numerals will be used for the same elements across all the figures. The delay cell 12 has a power supply input 50, a $P_{gate}$ input 76, a signal input 16, an $N_{gate}$ input 98 and a ground input 40. The signal input 16 is coupled to the gate 18 of a p-transistor 20 (P2) and a gate 22 of an n-transistor 24 (N2). The $P_{gate}$ input 76 is coupled to the gate of the charge transistor 42 (p-transistor, P1). The $N_{gate}$ input 98 is coupled to the gate of the discharge transistor 52. The inverter 32 has an input coupled to the drain 26 of the p-channel transistor 20 and the drain 28 of the n-channel transistor 24. The capacitor 36 is formed by four transistors 36a, 36b, 36c, 36d. Note that the source and drain of the transistors 36a, 36b, (36c, 36d) are both coupled to ground 40 (power supply 50). As a result, they act as capacitors. A fuse 118 is coupled transistors 36a, 36b to transistors 36c, 36d. If the fuse 118 is blown the capacitance is cut in half.

Figure 4:
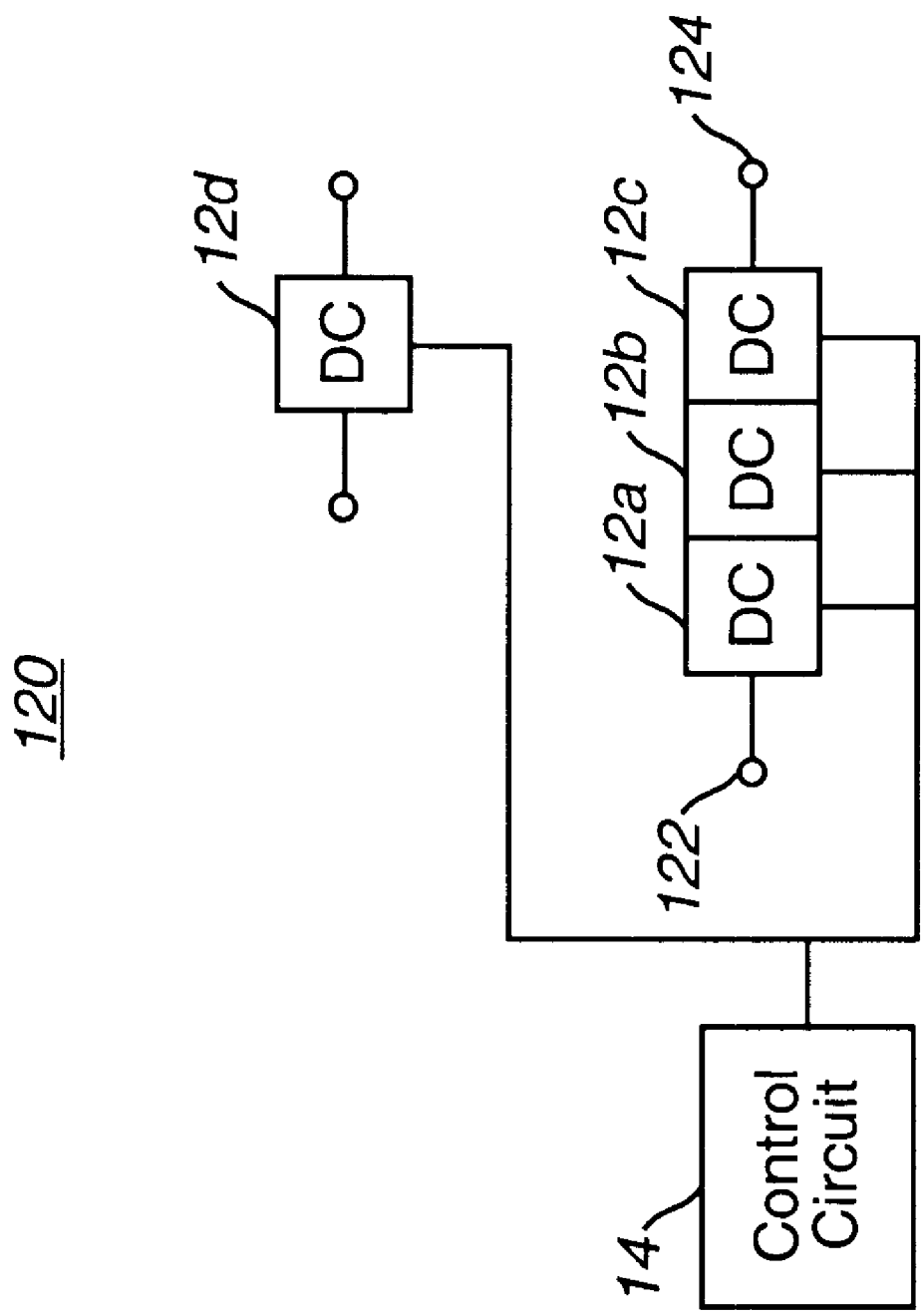
FIG. 4 is a block diagram of a circuit for providing a delay in accordance with one embodiment of the invention.

FIG. 4 is a block diagram of a circuit 120 for providing a delay in accordance with one embodiment of the invention. The circuit 120 has a control circuit 14. The control circuit 14 can be used to drive a number of cascaded delay circuits (plurality of delay cells) 12a, 12b, 12c. The cascaded delay cells have an input 122 and an output 124. By cascading the delay cells the length of the delay can be changed. Any number of delay cells can be cascaded. In addition, the control circuit 14 can be used to drive parallel delay cells 12d.

Figure 5:
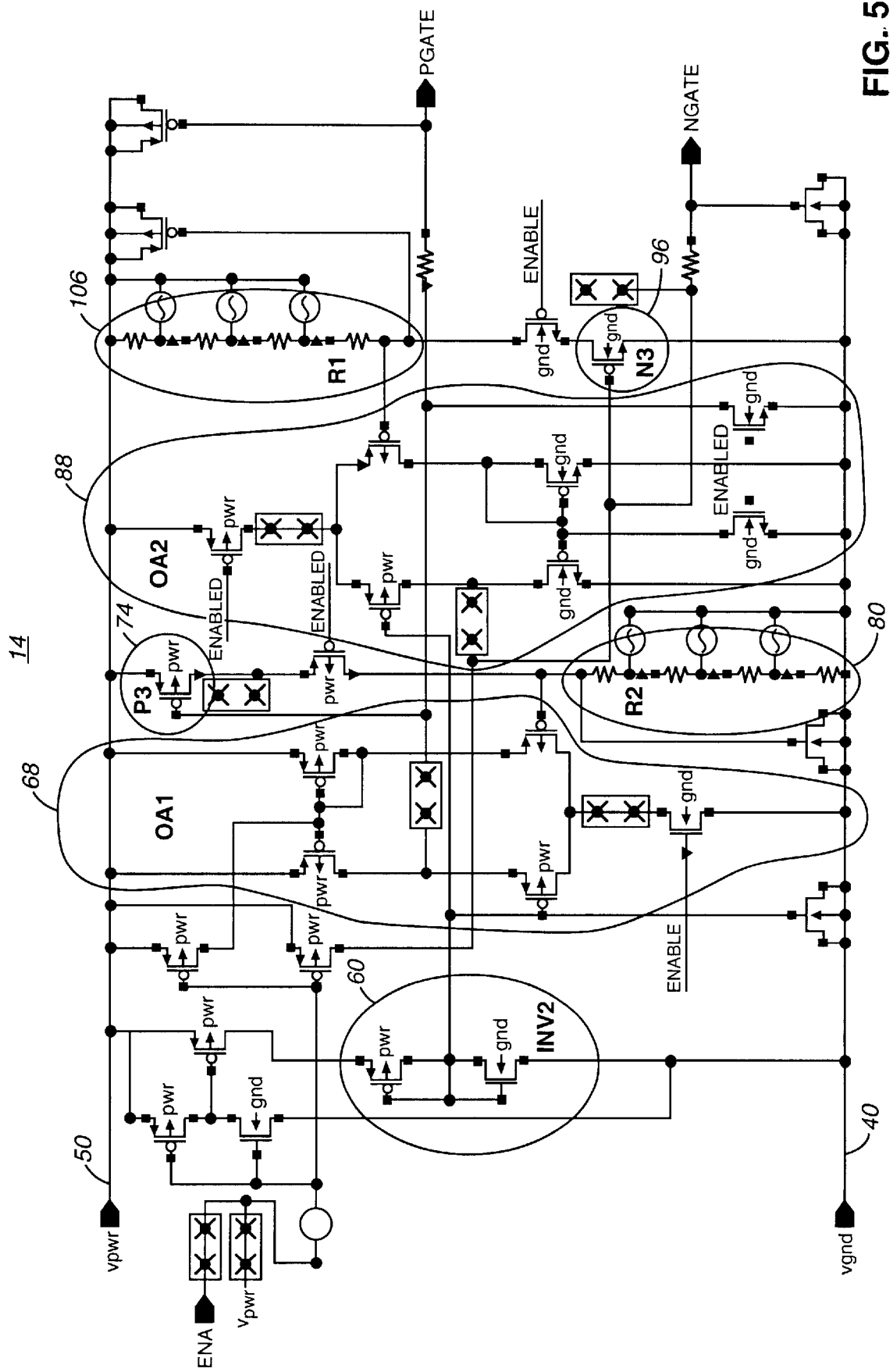
FIG. 5 is a schematic diagram of a control circuit in accordance with one embodiment of the invention.

FIG. 5 is a schematic diagram of a control circuit 14 in accordance with one embodiment of the invention. The circuit design for the inverter 60 and operational amplifiers 68, 88 are fairly standard in the electronics industry. All the major components are labeled in the schematic. The schematic is presented for completeness, however the invention is not limited to any particular implementation.

Figure 6:
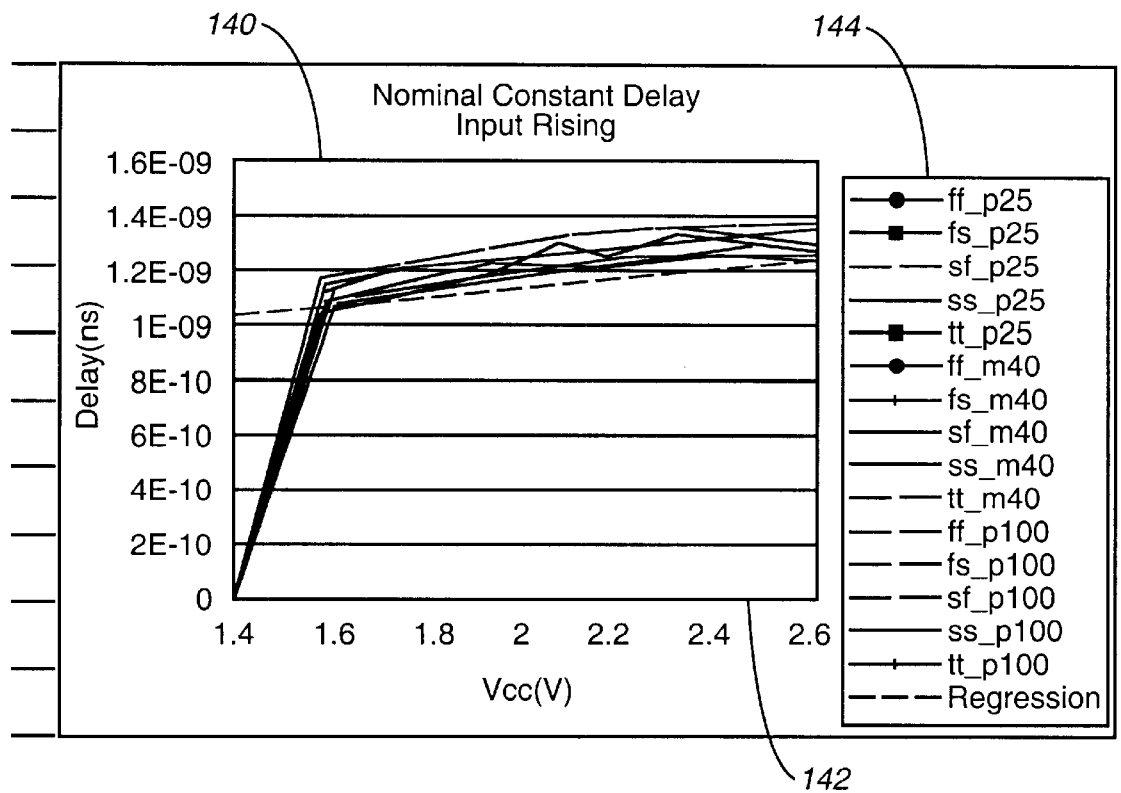
FIG. 6 is a graph of a simulation of the rise time delay for the circuit given a variety of different input parameters.
Figure 7:
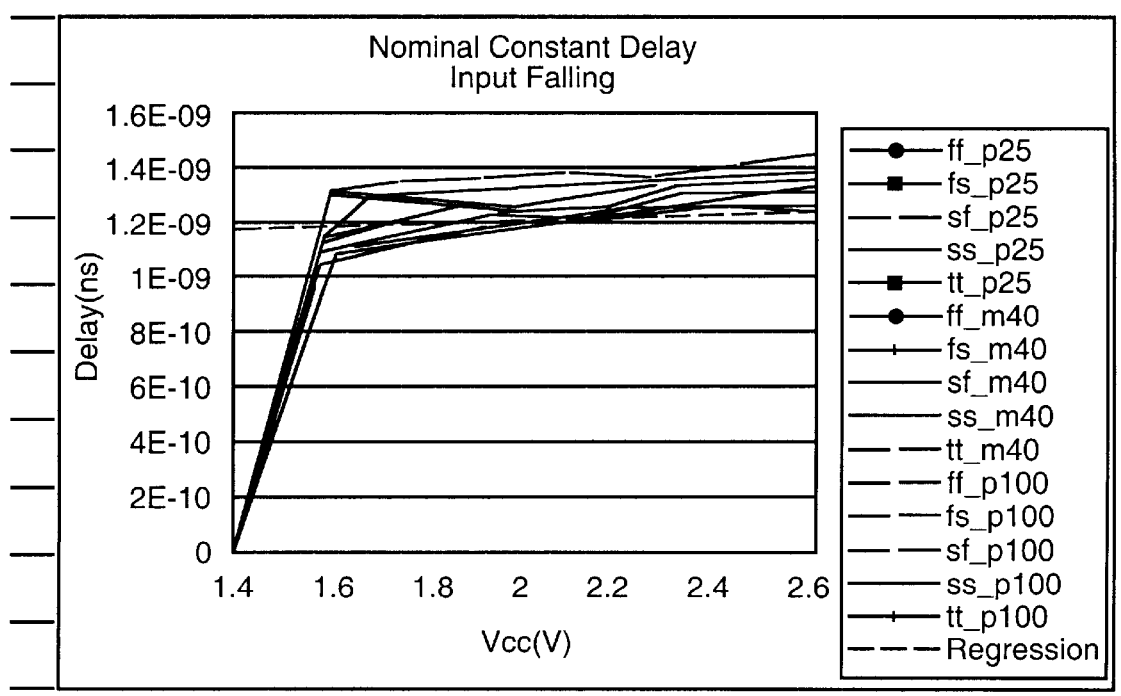
FIG. 7 is a graph of a simulation of the fall time delay for the circuit given a variety of different input parameters.

FIG. 6 is a graph of a simulation of the rise time delay for the circuit given a variety of different input parameters. The graph shows the delay for a rising edge on the y-axis 140 plotted against the supply voltage on the x-axis 142. A number of different scenarios are shown. The scenarios are identified by a legend 144 that has labels such as fs-p25. This means that the p-channel transistor 20 is fast (f), the n-channel transistor 24 is slow (s) and the temperature is 25° Celsius. Note, if the temperature is m25 it means the temperature is minus 25° Celsius. FIG. 7 is a graph of a simulation of the fall time delay for the circuit given a variety of different input parameters. The graphs show that the circuit provides a fairly constant delay time over a wide range of temperatures, supply voltages and process variations. The rise time delay has a range from about 0.9 ns to 1.2 ns at a control voltage of 1.6 volts and a range of 1.05 ns to 1.39 ns at a control voltage of 2.6 volts. The fall time delay has a range from about 1.1 ns to 1.3 ns for a control voltage of 1.6 volts and a range of 1.05 ns to 1.42 ns for a control voltage of 2.6 volts.

While the invention has been described in conjunction with specific embodiments thereof, it is evident that many alterations, modifications, and variations will be apparent to those skilled in the art in light of the foregoing description. For instance, the invention is not limited to FET transistors but any transistors may be used. Operational amplifiers are preferred, but other amplifiers may be used. A differential amplifier could be used instead of the inverters. The capacitor can be implemented as a transistor with the source and drain coupled to ground (power supply) and the gate coupled to the signal or vice versa. Physical resistors are preferred, however the resistors could be implemented as amplifiers with a negative amplification. Accordingly, it is intended to embrace all such alterations, modifications, and variations in the appended claims.

What is claimed is:

1. A circuit comprising:
   a means for delaying an electrical signal including a capacitor;

a means for charging the capacitor including an inverter having negative feedback;

a means for discharging the capacitor;

a first means for controlling the means for charging using a first resistive element; and a second means for controlling the means for discharging using a second resistive element.

2. The circuit of claim 1, wherein the first resistive element is a replica of the second resistive element.

3. A control circuit for a delay cell, comprising:

an inverter having negative feedback;

an operational amplifier having a non-inverting input coupled to an output of the inverter;

a mirror control transistor having a gate coupled to an output of the operational amplifier and a source coupled to a power supply voltage and a drain coupled to an inverting input of the operational amplifier; and a resistor having a first end coupled to a ground and a second end coupled to the drain of the mirror control transistor.

4. The circuit of claim 3, further including the output of the operational amplifier coupled to a gate of a control transistor of the delay cell.

5. The circuit of claim 4, wherein the mirror control transistor is a replica of the control transistor.

6. The circuit of claim 3, wherein the delay circuit includes an output inverter and the inverter is a replica of the output inverter.

7. The circuit of claim 3, further including:

a second operational amplifier having a non-inverting input coupled to the output of the inverter;

a second mirror control transistor having a gate coupled to an output of the second operational amplifier and a source coupled to a ground and a drain coupled to an inverting input of the second operational amplifier; and a second resistor having a first end coupled to a drain and a second end coupled to the power supply voltage.

8. The circuit of claim 7, further including an output of the second operational amplifier coupled to a gate of a control transistor of the delay circuit.

9. The circuit of claim 8, wherein the second mirror control transistor is a replica of the second control transistor.

10. A circuit comprising:

an inverter;

a delay cell having an output coupled to the inverter and having a charge transistor coupled to a capacitor; and a control circuit having an output coupled to a gate of the charge transistor, the output having a voltage that is proportional to a trip voltage of the inverter.

11. The circuit of claim 10, wherein the control circuit includes:

a replica inverter having an output coupled to an input of the replica inverter;

a charge operational amplifier having a non-inverting input coupled to an output of the replica inverter and an output of the charge operational amplifier coupled to the gate of the charge transistor;

a p-channel transistor having a gate coupled to an output of the charge operational amplifier and having a source coupled to a power supply voltage;

a charging resistor having a first end coupled to a ground and a second end coupled to a drain of the p-channel transistor and the inverting input of the charge operational amplifier.

12. The circuit of claim 11, further including:

a discharge operational amplifier having a non-inverting input coupled to an output of the replica inverter;

a n-channel transistor having a gate coupled to an output of the discharge operational amplifier and having a source coupled to the ground;

a discharging resistor having a first end coupled to a voltage power supply and a second end coupled to a drain of the n-channel transistor and the inverting input of the operational amplifier.

13. The circuit of claim 12, further including a discharge transistor in the delay cell having a gate coupled to an output of the discharge operational amplifier.

14. The circuit of claim 13, wherein the charging resistor is a replica of the discharging resistor.

15. The circuit of claim 13, wherein the p-channel transistor is a replica of the charge transistor.

16. The circuit of claim 13, wherein the n-channel transistor is a replica of the discharge transistor.

17. The circuit of claim 16, wherein the rise time of the delay cell is proportional to a resistance of the charging resistor times a capacitance of a capacitor of the delay cell.

18. The circuit of claim 17, wherein the fall time of the delay cell is proportional to a resistance of the discharging resistor times the capacitance of the capacitor of the delay cell.

19. The circuit of claim 10, further including a plurality of delay cells and associated inverters coupled to the control circuit.

* * * * *